(12) United States Patent
Sasaki et al.

(10) Patent No.: US 7,754,970 B2
(45) Date of Patent: Jul. 13, 2010

(54) HIGH FREQUENCY ELECTRONIC PART

(75) Inventors: Yasushi Sasaki, Fukui (JP); Seiichiro Yokoyama, Tokyo (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 198 days.

(21) Appl. No.: 11/922,330

(22) PCT Filed: May 31, 2006

(86) PCT No.: PCT/JP2006/310848

§ 371 (c)(1),
(2), (4) Date: Apr. 7, 2008

(87) PCT Pub. No.: WO2006/134774

PCT Pub. Date: Dec. 21, 2006

(65) Prior Publication Data
US 2009/0126970 A1    May 21, 2009

(30) Foreign Application Priority Data
Jun. 15, 2005    (JP)    ............................ 2005-175454

(51) Int. Cl.
*H01B 3/44*    (2006.01)
(52) U.S. Cl. ................................ 174/110 F; 174/117 F
(58) Field of Classification Search ............ 174/117 F, 174/250, 255, 256, 110 F
See application file for complete search history.

(56) References Cited
FOREIGN PATENT DOCUMENTS

| EP | 0 908 559 | 4/1999 |
|---|---|---|
| EP | 0 934 969 | 8/1999 |
| EP | 1 113 459 | 7/2001 |
| EP | 1 160 972 | 12/2001 |
| JP | 06-126872 | 5/1994 |
| JP | 09-151851 | 6/1997 |
| JP | 9-286867 | 11/1997 |
| JP | 11-025757 | 1/1999 |
| JP | 11-255908 | 9/1999 |
| JP | 11-288621 | 10/1999 |
| JP | 2000-091717 | 3/2000 |
| JP | 2000-169607 | 6/2000 |
| JP | 2001-247733 | 9/2001 |
| JP | 2001-345212 | 12/2001 |
| JP | 2002-249669 | 9/2002 |
| JP | 2002-344100 | 11/2002 |
| JP | 2003-060116 | 2/2003 |
| JP | 2004-35594 | 2/2004 |
| JP | 2004-063326 | 2/2004 |
| JP | 2005-100371 | 4/2005 |

*Primary Examiner*—Chau N Nguyen
(74) *Attorney, Agent, or Firm*—Morrison & Foerster LLP

(57) ABSTRACT

A high frequency electronic part comprising a conductor wiring for transmitting an electric signal of 100 MHz to 100 GHz, and an insulation layer composed of a void containing thermoplastic resin film orientated in at least one direction by stretching. The void containing thermoplastic resin film contains voids in the range between 3% and 45% by volume, the number of voids in a thickness direction of the film is 5 or more, and a ratio of the number of voids to film thickness defined by the following equation is in the range between 0.1 and 10 voids/μm:

ratio of the number of voids to film thickness (voids/μm)=the number of voids (voids) in film thickness direction/film thickness (μm).

7 Claims, 4 Drawing Sheets

HIGH FREQUENCY ELECTRONIC PART

FIELD OF THE INVENTION

The present invention relates an electronic part which comprises a conductor wiring which transmits an electrical signal of 100 MHz to 100 GHz and an insulation layer which is composed of a thermoplastics film containing voids.

BACKGROUND ART

In recent years, the signal band of information communication equipment, such as a Personal Handyphone System (PHS) phone, a cellular phone and the like has reached a GHz band, and the CPU clock time of a computer has become high frequency. Since the dielectric loss of an electrical signal is proportional to a product a square root of a specific inductive capacity and a dielectric dissipation factor of an insulating layer which forms a circuit, and a frequency an electrical signal, the dielectric loss becomes larger when a frequency of a used signal is higher. On the other hand, increase of the dielectric loss attenuates an electrical signal and degrades the reliability of the signal, and in order to such degradation, it is important to select a material for an insulation layer which material has a small dielectric constant and a dielectric dissipation factor.

Removal of a polar group in a molecular structure of a material is effective for the reduction of the dielectric constant and/or the reduction of the dielectric dissipation factor, various materials have been proposed. Among them, the fluoro-resins represented by especially polytetrafluoroethylene (PTFE) are widely used as insulating layers of various electrical components which use a high frequency signal since they have a dielectric constant and a dielectric dissipation factor both of which are small. However, PTFE has restrictions as to its workability, adhesion property and a price, and therefore a more versatile material is desired. Especially, in addition to the above-mentioned dielectric characteristics, thinning of an insulation layer is required in an electronic component, such as an antenna circuit for RF-ID, and a flexible flat cable.

The former antenna circuit for RF-ID is a high frequency circuit used for an IC chip embedded card or tag for non-contact authentication, and is an electronic apparatus or an electronic device which delivers and receives a signal with its outside by wireless. According to the manner with which a signal is transferred, an operating frequency and a form of the card or the tag, an antenna circuit is formed on a plastic film.

There is are two main manners with which signals are delivered and received as mentioned above, one is an "electromagnetic induction manner" and the other is a "microwave manner." The antenna of the former manner is a loop coiled form, and since communication is carried out by transform a magnetic field into an electric power, electromagnetic induction manner is referred to. The frequency band used for the RF tag of an electromagnetic induction manner is a 135 kHz or less band or a 13.56 MHz band, and the communication frequency is low. Therefore, in the antenna circuit of the electromagnetic induction manner, the low dielectric dissipation factor as to the insulation material is not so desired.

On the other hand, although the "microwave manner" does not have a transmitter of itself, a signal which impinges on the antenna of the tag from a reader is used wherein the received signal is modulated according to data of the tag, and thus modulated signal is simultaneously returned to the to the reader. This communication manner is also called the down spread modulation manner, and follows the principle of a radar. A UHF band (800 MHz to 1 GHz) or a 2.45 GHz band is used as a communication frequency band. A dipole antenna is used for the tag which antenna is designed according to a length of ½ to ¼ of the wavelength. The RF tag of the microwave manner has an advantage that a communication distance becomes longer compared with the tag of the electromagnetic induction manner, and it is widely and quickly used in a PD market etc. However, the frequency band used is high, and demand of the reduction in the dielectric dissipation factor as to the insulation material of the antenna circuit is very large.

The flexible flat cable is parallel arranged multi-core electric wire in the form of a thin tape structure in which both sides of rectangular conductors arranged parallel are sandwiched with plastic films, it is an electronic part which is indispensable to the miniaturization and the densification of a device as a lead wire for connecting printed circuit boards in an electronic parts or connecting a printed circuit board and an electronic part. The dielectric loss of the flexible flat cable will cause degradation of a transmitted signal, and error occurrence, which results in a reduction of the reliability of the electronic device.

However, the fluoro-resin has a restriction in a lower limit of the manufacturable thickness and its mechanical strength becomes insufficient upon thinning, a polyester is widely used as the insulation material in the above mentioned application since it is excellent in the mechanical property and able to b easily thinned. That is, no insulation material of the low dielectric loss is not put in practical use in those electronic parts.

It is noted that distributing voids (air) in an insulation material is also known as a manner to reduce the dielectric constant and/or the dielectric dissipation factor of the material. If this manner is adopted, an insulation material with a small dielectric constant can be obtained comparatively inexpensively. For example, it is disclosed that a perforated synthetic resin film is sandwiched by two sheets of synthetic resin films (see Patent Reference 1). Moreover, an electric/electronic device is disclosed of which insulation material contains fine hollow spheres (micro balloons of a glass, a silica, alumina or the like) such that its dielectric constant can become 2.5 or less, and an electric wire (magnet wire), a composite film, a varnish for coil impregnation, an adhesive tape, an insulation sleeve, and a prepreg material using such insulation material are also disclosed (see Patent Reference 2).

[Patent reference 1] Japanese Patent Unexamined Publication No. H09-151851

[Patent reference 2] Japanese Patent Unexamined Publication No. H11-288621

However, the above mentioned manners merely reduce the dielectric constant and the dielectric dissipation factor depending on a void fraction, and it has been said impossible to make an innovative dielectric loss. When foaming an insulation material which has a dielectric constant of $\in_0$ and a dielectric dissipation factor of $\tan \delta_0$, an effective dielectric constant of $\in$ and an effective dielectric dissipation factor of $\tan \delta$ are known as Wagner's equation as the following formulas (1) and (2) provided that a foaming extent (a volume ratio of air voids to an original insulation material) is set to be P:

[Equation 1]

$$\varepsilon = \frac{2\varepsilon_0 + 1 - 2P(\varepsilon_0 - 1)}{2\varepsilon_0 + 1 + P(\varepsilon_0 - 1)}\varepsilon_0 \quad (1)$$

[Equation 2]

$$\tan\delta = \tan\delta_0 + \frac{2\varepsilon_0 \tan\delta_0(1-P)}{2\varepsilon_0 + 1 - 2P(\varepsilon_0 - 1)} - \frac{\varepsilon_0 \tan\delta_0(2+P)}{2\varepsilon_0 + 1 + P(\varepsilon_0 - 1)} \quad (2)$$

FIGS. 1 and 2 show the relationships between the foaming extent P and the effective dielectric constant $\in$ and between the foaming extent P and the effective dielectric dissipation factor tan δ which are obtained according to said formula (1) and (2), respectively. It is seen from FIGS. 1 and 2 that when the foaming extent becomes larger, both of the effective dielectric constant also the effective dielectric dissipation factor becomes smaller. That is, the reduction of the dielectric constant and the reduction of the dielectric dissipation factor by the introduction of the voids which have been recognized up to now are only within the range predicted according to the above mentioned formula.

Moreover, although it is effective in the reduction in the dielectric constant, or the reduction in the dielectric dissipation factor to introduce voids into an insulation material, such introduction has been recognized up to now as a factor which reduces electrode performances of an insulation system. If an electrical voltage is applied to an insulation material in a solid state which has voids (air bubbles, voids) or gaps therein, air spaces having a lower dielectric breakdown strength will discharge firstly even with a low electrical voltage. If partial discharge like this is repeated, depressions (pits) of which ends have become sharp are present, and discharge will concentrate on the depressions, so that the electric field at the ends increases to cause the dendrite dielectric breakdown (tree dielectric breakdown). Once the tree (dendrite trace of the dielectric breakdown) is formed, an air space is made there, and it spreads longitudinally while the partial discharge there is involved. Finally, it results in the dielectric breakdown. That is, the introduction of the voids into the insulation material has been widely recognized as a cause of reducing the insulation performance up to now. When the thickness of an insulation layer becomes thinner, the insulation performance degradation becomes more problematic.

It is noted that using, as an insulation material, a biaxially stretched film which contains voids is disclosed as an example of the application to motor insulations for compressors (see Patent References 3, 4, and 5).

[Patent Reference 3] Japanese Patent Unexamined Publication No. H09-286867

[Patent Reference 4] Japanese Patent Unexamined Publication No. H11-25757

[Patent Reference 5] Japanese Patent Unexamined Publication No. 2000-169607

However, no effect of specific dielectric loss reduction has not been found out in any of those proposals. Patent reference 3 discloses that a void containing biaxially stretched polyester film having a specific gravity of 1.0 (apparent density is reduced by 29%) was used as an insulation material, a leakage current of a motor of a compressor was reduced by 23%. It can be easily understood from the above mentioned FIG. 1 that if 29% as the voids are introduced into the insulation, the dielectric loss is reduced by 23%. Moreover, Patent References 4 and 5 disclose that the dielectric constant of the insulation material falls according to the void content.

Moreover, an antenna circuit using a void containing film of which void content is t5 to 50% by volume, and which has been at least uniaxially stretched and oriented is disclosed (see Patent Reference 6).

[Patent Reference 6] Japanese Patent Unexamined Patent Publication No. 2005-100371

However, the invention disclosed in Patent Reference 6 does not correspond to the high frequency electronic parts defined according to the present invention, since it relates to a loop antenna circuit using an electromagnetic induction of a low frequency in a 135 kHz or less band or a 13.56 MHz band. This is clear from the configuration (a flat coiled form antenna (80 mm×48 mm)) of the antenna disclosed in Example 1 of Patent Reference 6. Moreover, the purpose of the invention of Patent Reference 6 is to provide an excellently designed antenna sheet in which none of an IC chip, an antenna nor irregularities of a circuit appears on a card surface, and not to provide the reduction of the dielectric loss of the electronic parts.

Namely, as to the application of the void containing film to the insulation material, only the example of the application to the motor insulation for the compressor and the example of the application to the antenna circuit in the less than 100 MHz electromagnetic induction manner are disclosed, and nothing about the outstanding property which is acquired for the first time when the film is applied to the high frequency circuit is neither disclosed nor suggested at all. Rather, the manner of forming the voids in the insulation material has been recognized to providing its insulation performance degradation, and thus it is a fact that it has been avoided.

Furthermore, as to the insulation layer of a high frequency circuit, the dielectric constant of an insulating layer and the dielectric dissipation factor may simultaneously be required because of the demands of formation of a delay circuit, impedance matching of wiring substrates in a low impedance circuit, miniaturization of a circuit pattern, and formation of a composite circuit wherein a capacitor is built in a substrate. Therefore, examples of electronic parts in which a high dielectric constant layer and a low dielectric constant layer are composed (see Patent References 7, 8 and 9).

[Patent Reference 7] Japanese Patent Unexamined Publication No. 2000-91717

[Patent Reference 8] Japanese Patent Unexamined Publication No. 2001-247733

[Patent Reference 9] Japanese Patent Unexamined Publication No. 2001-345212

Among those References, Patent Reference 7 discloses an example of an electronic part in which an insulating layer having a high dielectric constant and a low dielectric dissipation factor is used. In Patent References 8 and 9, an insulation layer having a high dielectric constant and a low dielectric dissipation factor is formed in the above mentioned insulating layer having a low dielectric constant and a low dielectric dissipation factor by distributing a high dielectric insulation material such as ceramic powder or metal powder subjected to an insulating treatment. However, it is essentially very difficult to make the dielectric dissipation factor small while maintaining a high dielectric constant by the manner distributing a low dielectric constant material such as voids (air) in the above mentioned insulation material.

As mentioned above, it is required to control the dielectric constant of an insulation layer in a high frequency electronic part according to a circuit to be formed. However, in any case, it is required to make an insulation layer to have a low dielectric dissipation factor in order to reduce the dielectric loss, and to avoid degradation of the insulation performance accompanied by the reduction of the dielectric dissipation factor.

SUMMARY OF THE INVENTION

The purpose of the present invention is based on the problem of the above mentioned prior art, and is to provide a high frequency electronic part which has a low dielectric loss, which is also excellent in an electric insulation characteristic, and which has a mechanical strength as well as thinness.

The high frequency electronic part according to the present invention which has been able to solve the above mentioned problem is a high frequency electronic part which comprises a conductor wiring for transmitting an electric signal of 100 MHz to 100 GHz, and an insulation layer composed of a void containing thermoplastic resin film orientated in at least one direction by stretching, characterized in that said void containing thermoplastic resin film contains voids in the range between 3% and 45% by volume, and the number of voids present in a thickness direction of the film is five or more, and a ratio of the number of voids to film thickness defined by the following equation is in the range between 0.1 and 10 voids/μm:

ratio of the number of voids to film thickness (voids/μm)=the number of void(voids)in film thickness direction/film thickness(μm).

Since the high frequency electronic material uses a thermoplastic film containing voids oriented in at least one direction by stretching as an insulation layer and a number of the voids exist in the thickness direction of the film, it has a very small dielectric loss in the high frequency range between 100 MHz and 100 GHz, excellent electrical insulation characteristics, and also thickness as well as a mechanical strength are excellent.

Figure 1:
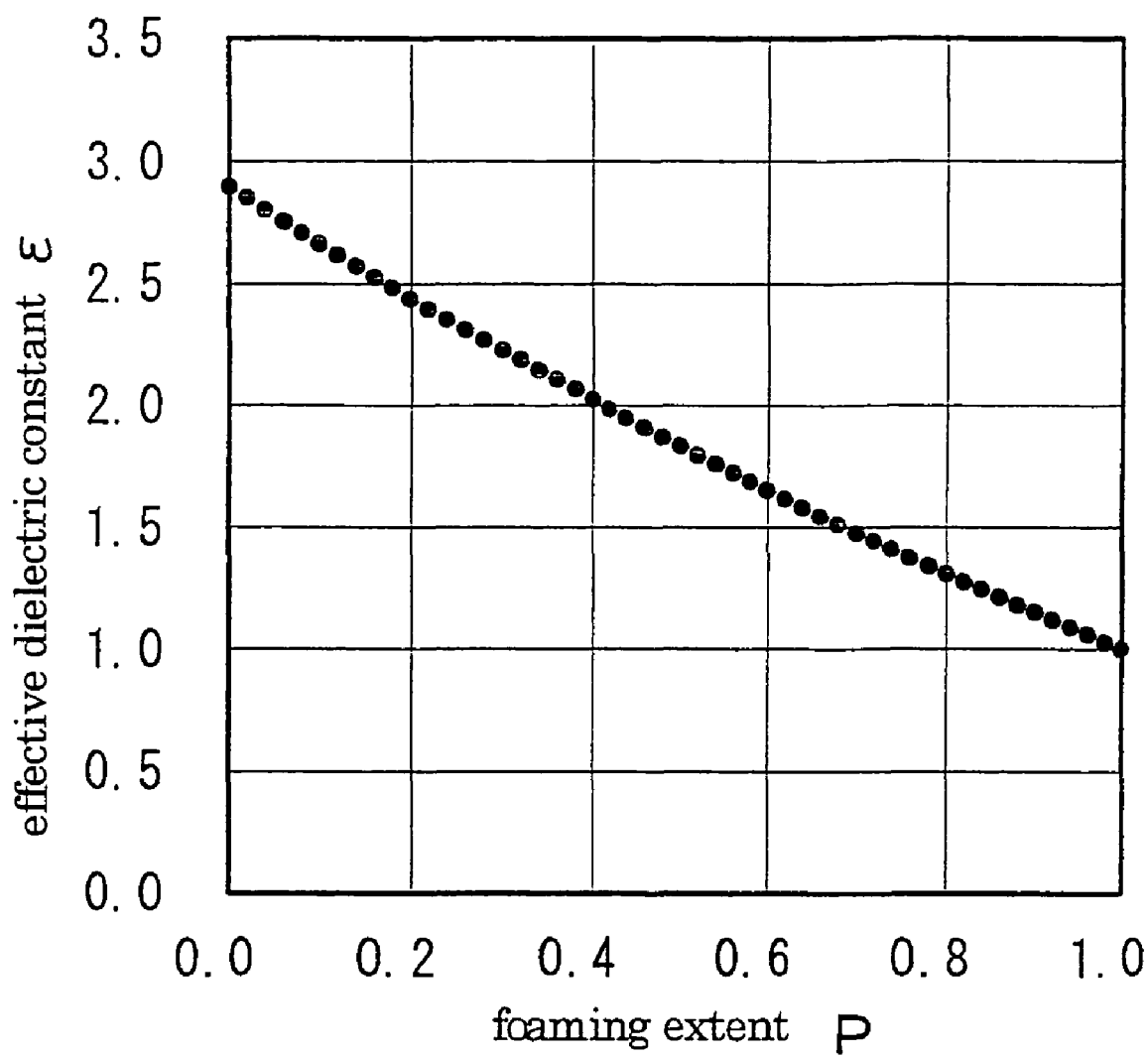
FIG. 1 is a drawing which shows a relationship between the foaming extent P and the effective dielectric constant $\in$ obtained according to the Wagner's formula.

DESCRIPTION OF NOTATIONS 1 void containing biaxially stretched laminate polyester film (film 2)
2 conductor pattern
3 IC chip
4 void containing biaxially stretchedlaminate polyester film (film 1)
5 void containing biaxially stretchedlaminate polyester film (film 1)
6 heat adhesive film
7 insulation film
8 adhesive
9 conductor

BEST MODE OF CARRYING OUT THE INVENTION

First, the configuration of the high frequency electronic parts according to the present invention, their effects and their preferable production process will be explained in detail.

(Conductor Wiring)

In the high frequency electronic parts of this invention, the conductor wiring is formed on an insulation layer made of a void containing film by which is oriented by stretching in at least one direction, and has a function to transmit an electric signal of 100 MHz to 100 GHz.

The method for the formation of the conductor wiring is not particularly limited but arbitrary. For example, the following methods may be employed: a method wherein a void containing stretched film and a metal foil are laminated through an adhesive; and a method wherein a metal film is directly on formed on a void containing stretched film by the vacuum deposition or the sputtering technique; then a wiring circuit is patterned by for example a photoresist using technique followed by for example a chemical etching technique so as to form a conductor wiring. Alternatively, a circuit may be formed by a metal conductor is patterned directly on the void containing stretched film followed by bonding.

In the electronic parts which transmit an electrical signal of less than 100 MHz, no remarkable reduction effect of the dielectric loss which is aimed by the present invention is not achieved. The effect of the present invention appears for the first time in the electronic parts which transmit an electrical signal of 100 MHz or more. When transmitting an electric signal of 300 MHz or more, especially 800 MHz or more, and particularly an electric signal of exceeding 1 GHz, such reduction effect readily appears.

It is noted that an antenna circuit for RF-ID and a flexible flat cable are exemplified as electronic parts in which the effect of the present invention appears most remarkably.

When the high frequency electronic parts of the present invention is used as the antenna circuit for RF-ID, the electromagnetic induction manner or the microwave manner may be adopted as long as the frequency to be used is 100 MHz or more, but it is desirable to adopt the microwave manner using an electromagnetic wave of the UHF band or a 2.45 GHz band. Furthermore, combination of the microwave manner and the electromagnetic induction may be used.

As one example of the electronic parts in which the effect of the present invention most remarkably appears, the flexible flat cable will be explained. The flexible flat cable is a parallel arranged multi-core electric wire in the form of a thin tape form in which both surfaces of rectangular conductors are sandwiched by plastic films. The conductors each having a rectangular cross section are spaced with a fixed distance, while an upper surface and a lower surface of the spaced conductors are sandwiched by a plastic tapes followed by the application of heat and pressure so as to bond joining parts of the surfaces with heat and pressure or an adhesive.

(Insulation Layer)

In the present invention, in order that the dielectric loss is remarkably reduced and that the dielectric breakdown voltage is increased, it is very important that the void containing thermoplastic resin film which is used as the insulation layer used in the RF electronic parts is oriented by stretching in at least the one direction.

The present inventors evaluated the high frequency properties of various void containing thermoplastic resin films by which the stretch orientation was carried out at least to the one direction, and have found that there was a film which shows the effect of the remarkable reduction in the dielectric dissipation factor in the high frequency range between 100 MHz and 100 GHz field, and such finding triggered the development of the present invention.

Figure 2:
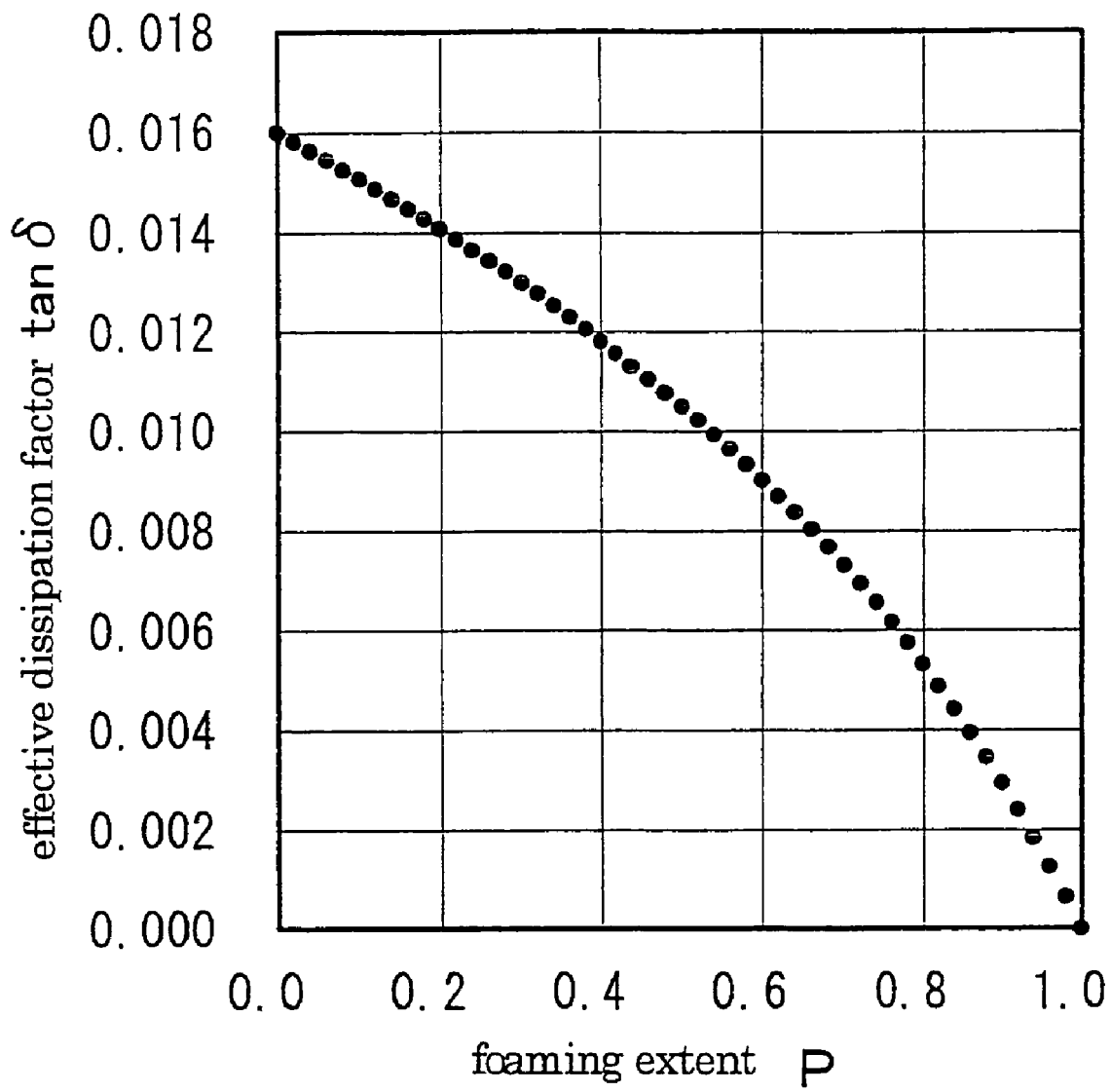
FIG. 2 is a drawing which shows a relationship between the foaming extent P and the effective dielectric dissipation factor tan δ obtained according to the Wagner's formula.

For example, a polyester film which does not substantially contain a void therein, the dielectric dissipation factor at 1 GHz was 0.016. When voids were formed in such polyester film so that it contained 20% by volume of air space (foaming extent P: 0.2), an estimated figure of the dielectric dissipation factor according to the prior art is 0.014 when the estimation is carried out according to FIG. 2. On the other hand, in the invention of the present application, when the biaxially-stretched polyester film is formed which has the voids of 20% by volume % therein (foaming extent P: 0.2), its dielectric dissipation factor was actually was 0.004. Therefore, the reduction effect of the dielectric dissipation factor according to the present invention by means of the voids in the film is so excellent as not to expected by the prior art.

In this invention, it is preferable that an upper limit of the dielectric dissipation factor at 1 GHz of the void containing film used as the insulation layer of the high frequency electronic parts is 0.010, and it is particularly preferable that such upper limit is 0.005. Also, when the mechanical strength of the film is required, a lower limit of the above mentioned dielectric dissipation factor is preferably 0.0005 and particularly preferably 0.001.

When the dielectric dissipation factor at 1 GHz exceeds 0.010, the reduction effect of the dielectric loss in the high frequency electronic parts becomes insufficient. On the other hand, a lower dielectric dissipation factor at 1 GHz is more preferable, but if a content of the voids inside the film is remarkably increased, the mechanical strength of the film may be considerably decreased. As the manner for increasing the content of the voids in the film, the following methods may be exemplified: a method in which an amount of an thermoplastic resin which is to be a void generating agent and which is incompatible with a thermoplastic resin as a matrix; a manner in which a thermoplastic resin which is incompatible with a thermoplastic resin as a matrix is used provided that a difference between a surface tension of the former thermoplastic resin and the latter thermoplastic resin is large; and a manner in which an stretching stress is increased upon stretching the film.

In the present invention, an upper limit of the content of the voids of the above mentioned void containing film is 45% by volume %, preferably 40% by volume and particularly preferable 35% by volume. On the other hand, a lower limit of the content of the voids of the above mentioned void containing film is 3% by volume, preferably 5% by volume and particularly preferable 10% by volume.

Furthermore, the present inventors also evaluated the electrical insulation characteristics of the void containing film. It has been found that its dielectric breakdown voltage is clearly higher and its electrical insulation characteristics are excellent when compared with a prior art film which contained substantially no void.

When the void containing film is subjected to a dielectric breakdown test, it is theoretically expected that partial discharge should begin in the voids ahead of the thermoplastic resin as the matrix. However, in the practical dielectric breakdown test, there is almost no difference in the discharge inception voltage between the void containing film and the film which contains no void. On the other hand, it has been found that with the film which contains no void, the whole film often results in complete dielectric breakdown in one time discharge in many cases, but with of the void containing film, the whole film does not result in the dielectric breakdown in one time discharge, and discharging many times is required for the complete dielectric breakdown. Therefore, it is considered that the dielectric breakdown voltage becomes higher in the void containing film than in the film with which contains substantially no void.

In the present invention, the void containing film used as the insulation layer has a lower dielectric dissipation factor compared with the prior art common sense. The reason why the outstanding property that the dielectric breakdown voltage is high is acquired is not completely clear, but it is considered that the distribution conditions and forms of the voids in the film contribute. Especially, it is expected that the improvement effect of the dielectric breakdown voltage is due to the presence of a large number of the voids in the thickness direction of the film as separate dispersing elements in the film.

Probably, what is destroyed by one time discharge is only the void which discharges first in the thickness direction of the film. It is considered that even though such void is destroyed, a continuous advance of a tree (a dendrite trace of the dielectric breakdown) is suppressed as a result since a new void (interface) is developed one after another. Further, it is supposed that in order to produce the dielectric breakdown which passes through the whole film at one stretch, it is necessary to apply an extremely high electrical voltage. This idea is consistent with the experimental results. That is, compared with the dielectric breakdown voltage of the film which contains no void, the higher dielectric breakdown voltage is obtained by forming many voids which exist in the film thickness direction.

It is preferable that the dielectric breakdown voltage of the void containing film having a thickness of 250 micrometers of used as an insulation layer for the high frequency electronic parts according to the present invention specifically exceeds 1.2 times of that of the film which contains substantially no void. Here, the film which contains substantially no void is intended to mean a film of which ratio of the number of voids to film thickness is smaller than 0.0 voids/μm.

The technical feature of such void containing film with the remarkable dielectric loss and the large dielectric breakdown voltage is that it contains voids of 3 to 45% by volume, the number of voids present in the thickness direction of the film is at least 5, and many voids exist in the film thickness direction while satisfying that the ratio of the number of voids to film thickness defined by the following formula is between 0.1 and 10 voids/μm:

ratio of the number of voids to film thickness(voids/μm)=the number of voids(voids)in film thickness direction/film thickness(μm).

Although it is preferable that the ratio of the number of voids to film thickness of the void containing film is large from a viewpoint of the dielectric breakdown voltage, the strength of the film is generally likely to reduce. In order to increase the ratio of the number of voids to film thickness, the following manners are preferable: (1) a manner in which voids in the film are finely divided physically or chemically so as to increase the number of the voids and (2) a manner in which voids are extended thinly into discs so that areas of the voids are increased with respect to the thickness direction of the film. n order to make the dielectric breakdown voltage high while maintaining practically required film strength, the upper limit of the above mentioned ratio of the number of voids to film thickness is preferably five voids/μm, and more preferably 1 void/μm.

It is noted that the manner in which in which the voids in the film are finely divided physically or chemically so as to increase the void number is arbitrary, and is not particularly limited. For example, a chemical manner in which a thermoplastic resin "a", a thermoplastic resin "b1" which is incompatible with the thermoplastic resin "a", and a thermoplastic resin "b2" which is incompatible with "a" or "b1" and of which surface tension is larger than that of the thermoplastic resin "b1" or a polyalkylene glycol or its derivative are used together so as to finely divide the incompatible thermoplastic resin "b", and a physical manner in which a static mixer is installed in a melt extrusion process of the resin so as to finely divide the incompatible thermoplastic resin "b" by means of the shearing stress of the mixer may be exemplified.

Furthermore, in order to make dielectric breakdown voltage of a film high even with the thickness of the void containing film becomes thin, it is important to make the number of voids in the thickness direction of the film five or more. Moreover, the thickness of the void containing film used as the insulation layer is preferably 10 to 500 μm, and it may be selected within such range based on the application, required properties and the like of the film. The upper limit of the film thickness is preferably 350 μm, and particularly preferably 250 μm. On the other hand, from the viewpoint of ensuring the stabilized dielectric breakdown voltage, the lower limit of the film thickness is 20 μm and particularly preferably 30 μm.

Next, the suitable production process of the void containing thermoplastic resin film used for the high frequency electronic part of the present invention as the insulation layer will be explained.

In the present invention, the void containing film used as the insulation layer is produced by (1) a process comprising extruding, into a sheet form, a resin composition having a "sea-and-island structure" which is composed of a thermoplastic resin "a" as the matrix and dispersing elements of a thermoplastic resin "b" which is incompatible with said thermoplastic resin "a", and subsequently stretching such unstretched sheet in at least one direction so as to form voids (air bubbles) around the dispersing elements, or (2) a process comprising extruding, into a sheet form, a resin composition comprising a thermoplastic resin "a" containing inorganic particles or as the matrix and heat-resistant organic particles, and subsequently stretching such unstretched sheet in at least one direction so as to form voids (air bubbles) around the particles. The former process (1) is preferable since the incompatible thermoplastic resin which functions as a void generating agent has a small density so that more voids are formed The process (1) in which the above mentioned "sea-and-island structure" is referred explained in detail.

A component which forms the sea element of the void containing film In the above mentioned process (1) is not particularly limited and thus arbitrary provided that the component is a thermoplastic resin which is able to be subjected to a stretching treatment for orientation, but a polyester is suitable from a viewpoint of heat-resistance.

In the present specification, the polyester is a polyester which is prepared by polycondensation of an aromatic dicarboxylic acid (such as terephthalic acid, isophthalic acid, naphthalene dicarboxylic acid and so on) or an ester thereof, and a glycol (such as ethylene glycol, diethylene glycol, 1,3-propanediol, 1,4-butanediol, neopentyl glycol and so on). Such polyester may be produced by (1) a direct polymerization process in which the aromatic dicarboxylic acid and the glycol are directly subjected to an esterification reaction followed by the polycondensation, (2) a transesterification process in which an alkyl ester of the aromatic dicarboxylic acid and the glycol are subjected to a transesterification reaction followed by the polycondensation, or (3) a process in which a diglycol ester of the aromatic dicarbolxylic acid is subjected to the polycondensation.

As a representation example of the above mentioned polyester, a polyethylene terephthalate, a polytrimethylene terphthalate, a polybutylene terephthalate or a polyethylene-2, 6-naphthalate may be mentioned. The above mentioned polyester may be a homopolymer and may be one copolymerized with a third component. Among these polyester, a polyester contains preferably more than 70 mol % more than 80 mol % and further preferably more than 90 mol % of an ethylene terephthalate unit, a trimethylene terephthalate unit or an ethylene-2,6-naphthalate unit.

Also, as to a material which forms the island element, there is no particularly limitation in the thermoplastic resin which is incompatible with the polyester, and the resin may be a homopolymer or a polymer containing copolymerization components. However, it is preferable that the polymer mainly comprises a polyolefin or a polystyrene. Further, the polystyrene is not necessarily limited to a homopolymer and it may be a copolymer which is produced by copolymerizing various components. However, when using the copolymer, it is required for a copolymerized component not to degrade the effect of the present invention. It is noted that, an amount of the thermoplastic resin to be blended which is incompatible with the polyester is desirably 1 to 30% by mass to all the raw materials used for the production of the film.

The polyolefin means apolyethylene, a polypropylene, a polymethylpentene, various cyclic olefin based polymers and copolymers thereof. Among those polymers, the polymethylpentene is preferable since it is unlikely to be softened even under an elevated temperature and it shows excellent void generation property. When using the polymethylpentene as a main component of the polyolefin, it is not necessarily required to use the polymethylpentene alone, and other polyolefin(s) may be added as an additional component. As the additional component as a resin, it is not particularly limited, but a polymer such as a polyethylene, a polypropylene, and a copolymer in which various components are copolymerized to those polymers are exemplified. There is no particular limitation as a viscosity of the polyolefin added as the additional component, and it is important that an amount of the additional component does not exceed an amount of the resin added as the main component.

The polystyrene means a thermoplastic resin which includes a polystyrene structure as a basic element, and includes homopolymers (such as an atactic polystyrene, a syndiotactic polystyrene, an isotactic polystyrene and so on), a modified polystyrene resin in which other component is graft polymerized or block polymerized (such as a high-impact-polystyrene resin), and a modified polyphenyleneether resin, and further includes a mixture of such polystyrene based resin(s) and a thermoplastic resin such as a polyphenyleneether which is incompatible with the polystyrene based resin(s).

When using the polyolefin and the polystyrene together as thermoplastic resin which is incompatible with the polyester, it is preferable that a ratio ($\eta 0/\eta s$) is 0.80 or less wherein $\eta 0$ is a melt viscosity (poise) of the polyolefin and $\eta s$ is a melt viscosity (poise) of the polystyrene. The above mentioned melt viscosity ratio ($\eta 0/\eta s$) is more preferably 0.60 or less, and most preferably 0.50 or less. If the above mentioned melt viscosity ratio exceeds 0.80, distribution of the polystyrene based resin phase in the dispersed particles becomes nonuniform, and the phase structure of the dispersed particles becomes unstable. As a result, the dispersion condition of the dispersed particles is worsened, so that it becomes difficult to satisfy the ratio of the number of voids to film thickness specified by the present invention.

In order to further improve the shielding property of the void containing film, white particles may be contained in the range below 30% by mass depending on a demanded extent of the shielding property. As the white particles, those made of titanium dioxide, calcium carbonate, barium sulfate, zinc sulfide and the like are mentioned. However, since titanium dioxide is a dielectric material, it should not be used or a minimum amount thereof should be used for the application wherein a low dielectric constant is required. Further, an additive(s) such as a flame retardant, an antioxidant, a UV absorber and the like may be used together as far as the effect of the present invention is not degraded.

Although the void containing film used as the insulation layer according to the present invention may be a monolayer, it may be of a laminate form of two or more layers in order to have other functions or to prevent fracture of the film. For example, a polyester layer or a resin layer which has an adhesive property to a polyester is laminated on one surface or both surfaces of the void containing film by the co-extrusion method. Moreover, the resin to be laminated may contain a void generating agent which is different from or the same as that of the void generating agent of the void containing film Moreover, the above mentioned void containing film may have an applied layer on one or both surfaces thereof. By providing such applied layer, an adhesive property and/or an antistatic property may be improved. As a compound which constitutes the applied layer, a polyester based resin is preferable, but other compound (such as a polyurethane resin, a polyester-polyurethane resin, an acrylic resin or the like) which is known as a means to improve the adhesive property and/or the antistatic property of the usual polyester film may be used.

As a method of preparing the applied layer, a usually used method may be used such as a gravure coat method, a kiss coat method, a dip method, a spray coat method, a curtain coat method, an air knife coat method, a blade coat method, and a reverse roll coat method. As a phase to apply, any method of a method of applying before stretching the film, a method of applying after stretching the film, a method of applying to a surface of the film after the orientation processing and the like may be possible.

The production process of the above mentioned void containing film is arbitrary, and not restricted especially. For example, a general process may be used in which after carrying out melting of the mixture having the above mentioned composition, and carrying out extrusion to prepare an unstretched film form, such film is stretched in at least one direction.

In the above production process (1) of the void containing film, the thermoplastic resin which is incompatible with the polyester is dispersed in the polyester in the step in which the raw material is melted and extruded. Although a polyester and a resin which is mixed with the polyester used in the examples of the present invention were supplied in the form of pellets, the present invention is not limited to those examples. The raw material which was supplied to an extruder for the melt extrusion was prepared by mixing pellets of the resins depending on an intended composition. However, since specific gravities of the polyester and the polyolefin which are used in the present invention are generally highly different, it preferable to add a means which prevent a mixture of the pellets from separating again in the course of being supplied to the extruder once such mixture has been prepared. As to such means, a method may be exemplified in which after combining and kneading a portion or all of the raw material resins beforehand, the resins are palletized to prepare master batch pellets. In the present invention, such method was used, but the present invention is not especially limited to such method unless the effect of the present invention is degraded.

Further, in the extrusion of the mixed system of these incompatible thermoplastic resins, the resins have a re-agglomeration property by means of an action to decrease an interfacial surface energy of the resins even after the resins are melted and mixed so as to finely disperse the resins. Such property disperses the void generating agent coarsely when the unstretched film is extruded, which results in a phenomenon which prevents the aimed properties from appearing.

In order to prevent the above, it is preferable to use a twin screw extruder with a higher kneading performance so as to finely disperse the void generating agent beforehand when the film according to the present invention is prepared.

Moreover, when using such extruder is difficult, it is preferable to supply the resins to a feed block or a dice after the void generating agent is finely dispersed by passing the resins discharged from the extruder through a static mixer as an auxiliary means.

As the static mixer used here, the so called static mixer, an orifice, or the like can be used. However, when using the static mixer, cautions are required since thermally degraded resins may stay in a melt line. It is considered that the re-agglomeration of the incompatible molten resin advances under a low shear with time, and therefore it is a basic solution thereof to reduce a residence time of the resins in the melt line between from the extruder. In the present invention, such residence time is preferably 30 minutes or less, and more preferably 15 minutes or less.

The conditions which stretch and orient the unstretched film obtained as mentioned above are closely related to the physical properties of the film. The stretching/orienting conditions will be explained below with reference, as an example, to the most conventional sequentially biaxially stretching method, and particularly the method in which an unstretched film is stretched longitudinally and subsequently transversely.

In the longitudinally stretching step, two or more rolls are used each having a different peripheral speed. As a heating means in such step, a heating roll(s), a non-contact type heating technique or combination thereof may be used. Then, the monoaxially stretched film is supplied to a tenter so as to transversely stretch the film at a temperature not lower than Tg and not higher than Tm-10° C. to 2.5 to 5 times. It is noted that Tg means a glass transition point and Tm means a melting point.

The above-mentioned biaxially stretched film is subjected to a heat treatment if necessary. The heat treatment is preferably carried out in the tenter at a temperature preferably in the range between Tm-60° C. and Tm.

Next, in the above mentioned a manner (2) in which the voids are extended thinly into the disc forms so that the areas of the voids are increased with respect to the thickness direction of the film, it is preferable that the transversely stretching is carried out in least two steps each at different temperatures and the final transversely stretching is carried out at a temperature not lower than 180° C. The reason why the transversely stretching temperatures are specifically defined is that there is a problem in the conventional stretching temperature is so low as 80 to 140° C. that no sufficient deformation of the voids can be achieved and obtaining thin voids is difficult.

The above mentioned transversely stretching step is very effective manner which overcomes the problem described above. Specifically, the first transversely stretching is carried out at a temperature between 100° C. and 150° C. to a stretching ratio of 2.0 to 3.0 times, and the second transversely stretching is carried out at a temperature between 180° C. and 230° C. to a stretching ratio of 1.2 to 2.0 times. It is necessary that the stretching ratio of the first transversely stretching is smaller than that of the longitudinal stretching. The first stretching is for obtaining a biaxially stretched film in which the voids are sufficiently generated, and the second stretching is to make the voids thin and balanced longitudinally and transversely, and has almost no effect to increase the number of the voids. It is noted that the sum total of the first transversely stretching ratio and the second transversely stretching ratio may exceed the longitudinal stretching ratio.

After the above mentioned stretching, it is preferable that the heat treatment is carried out, and the temperature of the treatment is preferably not lower than 200° C., more preferably not lower than 220° C., and further preferably not lower than 230° C. The above mentioned heat treatment may be performed after performing a relaxation treatment of 2 to 5%.

Other Embodiment of Insulation Layer in the Present Invention

As also explained in the above mentioned background art chapter, there are demands as to the insulation layer for the high frequency circuit such as the formation of a delay circuit, the impedance matching of the wiring substrate in the low impedance circuit, the miniaturization of the circuit pattern, and the formation of a composite circuit wherein the capacitor is built in the substrate, and the higher dielectric constant and the lower dielectric dissipation factor of the insulation layer may simultaneously be required.

In such case, it is preferable that the above mentioned void containing film has a layer structure having at least two layer of surface layer (B)/void containing layer (A) wherein the surface layer (B) is preferably made of a resin composition which contains 0.01% to 60% by mass of ceramic particles or metal particles subjected to an insulating treatment. Further, the ceramic particles or the metal particles subjected to the insulating treatment preferably have a mean diameter of 0.01 μm to 10 μm.

By means of the above configuration, the surface layer (B) is able to be a high dielectric constant layer which has a dielectric constant of 3.0 to 100 at 1 GHz, and the void containing layer (A) is able to be a low dielectric constant layer which has a dielectric constant of 1.5 to 3.0 at 1 GHz. Further, the dielectric constant of the whole film is able to be controlled arbitrarily by means of the above mentioned lamination structure.

For the ceramic particles which may be contained in the surface layer (B), the following high dielectric constant insulators may be exemplified: $MgSiO_4$, $MgTiO_3$, $ZnTiO_3$, $ZnTiO_4$, $TiO_2$, $CaTiO_3$, $SrTiO_3$, $SrZrO_3$, $BaTi_2O_5$, $BaTi_4O_9$, $Ba_2Ti_9O_{20}$, $Ba(Ti, Sn)_9O_{20}$, $ZrTiO_4$, $(Zr, Sn)TiO_4$, $BaNd_2Ti_5O_{14}$, $BaSmTiO_{14}$, $Bi_2O_3$—$BaO$—$Nd_2O_3$—$TiO_2$ based material, $La_2Ti_2O_7$, $BaTiO_3$, $Ba(Ti, Zr)O_3$ based material, and $(Ba, Sr)TiO_3$ based material.

Similarly, as the metal particle subjected to the insulating treatment, the following high dielectric constant insulators may be exemplified: what is obtained by mixing gold, silver, palladium, copper, nickel, iron, cobalt, zinc or the like with an aqueous solution of an insulation material such as phosphoric acid, boracic acid, magnesium oxide or the like followed by drying, an Mn—Mg—Zn based material, an Ni—Zn based material, an Mn—Zn based material, carbonyl iron, an Fe—Si based material, an Fe—Al—Si based material, an Fe—Ni based material, and the like. Those particles may be added not only in said surface layer (B) but also in said void containing layer (A) and other layer(s) if necessary.

In addition to the highly dielectric ceramic particles or the metal particles subjected to the insulating treatment, an additive(s) such as particles of kaolinite, talc, calcium carbonate, a zeolite, alumina, barium sulfate, carbon black, zinc oxide, zinc sulfide, and an organic white pigment, a flame retardant, an antioxidant, and a UV absorbent may be used together in the surface layer (B) in the range which does not degrade the effect of the present invention for the purpose of providing the film with a function such as a slip property, a shielding property, a flame retardance, lightfastness or the like.

EXAMPLES

Next, the effect of the present invention will be explained using Examples and Comparative Examples.

First, the evaluation methods of the characteristics used in the present invention will be shown below:

Evaluation Methods (1) Intrinsic Viscosity of Polyester Resin

According to JIS K 7367-5, the measurement was carried out at a temperature of 30° C. while using a mixture solvent of a phenol (60% by mass) and 1,1,2,2-tetrachloroethane (40% by mass) as a solvent.

(2) Melt Viscosity of Polymethylpentene and Polystyrene ($\eta 0$ and $\eta s$)

Using a flow tester (manufactured by Shimadzu, CFT-500), the melt viscosities were measured at a resin temperature of 285° C. and a shear rate of 100/second. It is noted that since it is difficult to fix the shear rate at 100/second, the measurement of the melt viscosity at a shear rates of 100/second was obtained as follows: using suitable loads, a melt viscosity at a certain shear rate which was smaller than 100/second and a melt viscosity at a certain shear rate which was larger than 100/second were measured, and the measurements were plotted on a double logarithmic chart (vertical axis: melt viscosity, horizontal axis: shear rate) in which the plotted measurements were connected with a straight line, and the melt viscosity at a shear rates of 100/second was obtained by interpolation.

(3) Thickness of Film

According to JIS K 7130 "the foamed plastics—film and sheet-thickness measurement method." Using an electronic micrometer (manufactured by Mahr, Militron 1240), a film thickness was measured at five points per each square sample having a size of 5 cm×5 cm (totally four samples), and thus obtained twenty measurements were averaged to obtain the thickness of the film.

(4) Apparent Density of Film

According to JIS K 7222 "measurement of foamed plastics and rubber—apparent density measurement", the apparent density was measured. It is noted that the unit was converted into $g/cm^3$ in order to make the expression simple.

(5) Void Content of Film

As to a piece of a film to be measured, the apparent density was obtained by the above mentioned above (3). Next, the film piece was ground sufficiently finely by a freeze grinder. Thus ground sample was remelted while degassing under vacuum, and then solidified into a sheet form. The sheet was taken out of the vacuum, and cooled sufficiently to the room temperature, and then the apparent density of the sheet was measured again. The void content (%) was obtained by dividing the difference of the apparent densities before and after the degassing by the density after the degassing.

(6) Specific Inductive Capacity and Dielectric Dissipation Factor of Film

Using dielectric material measuring electrodes (manufactured by Agilent Technologies, HP16453 A-type) and an impedance material analyzer (manufactured by Agilent Technologies, HP4291 A-type), properties at 1.0 GHz were estimated in a parallel plate method. Plural of samples each having a size of 25 mm×25 mm were prepared by cutting the film to provide such samples, and a total thickness of such samples stacked one on top of the other was between 0.9 mm and 1.10 mm. Thus stacked samples were inserted between the above mentioned electrodes, and specific inductive capacity and the dielectric dissipation factor were measured. The same measurement was carried out five times and the average was calculated. It is noted that such measurements were carried out in a laboratory of which temperature and relative humidity were controlled to 25° C. and 50%, respectively.

(7) Dielectric Breakdown Voltage of Film

According to JIS C 2318-1997, "5. 3. 10(1) alternating voltage method", measurement was carried out in the oil. Diameter of upper and lower electrodes used for the measurement were 25 mm and 75 mm, respectively. Plural of samples each having a size of 250 mm×250 mm were prepared by cutting the film to provide such samples, and a total thickness of such samples stacked one on top of the other was between 250 μm. When the thickness was not 250 μm, measurements were carried out as to the thickness just before 250 μm and also as to the thickness just after 250 μm, and thereafter the dielectric breakdown voltage (V1) at a thickness of 250 μm was obtained on a pro-rata basis.

The same measurements were carried out as to two biaxially stretched transparent polyester films (manufactured by Toyobo, E5001) having thicknesses of 50 μm and 250 μm respectively, and thus obtained measurements were assumed to be dielectric breakdown voltage (V0) of a film which contains substantially no void. Then, a ratio of the dielectric breakdown voltages (V1/V0) was obtained at the thickness of 250 μm.

(8) The Number of Voids Present in Thickness Direction of Film, and Ratio of the Number of Voids to Film Thickness For the observation of the voids in a film cross section, a scanning electron microscope was used, and five different points on a cut cross section of a sample which section is perpendicular to the film and which section is parallel to the longitudinally stretching direction were observed. The observation was carried out with an appropriate magnification ratio between 300 times and 3000 times, and photos were taken such that the void distribution state across a whole thickness of the film was confirmed. Then, a straight line which is perpendicular to the film surface is drawn at any point of the photo, and the voids which were under the straight line were counted. The number thus counted is defined as the number of voids in the thickness direction of the film (the number of voids). Further, a total thickness (μm) of the film was measured along the straight line, and the number of voids was divided by the total thickness of the film so as to obtain the ratio of the number of voids to film thickness of the film (voids/μm). It is noted that such measurement was carried out five times per one photo, and measurements were carried out at totally 25 points, and an average figure of such measurements was obtained as an average ratio of the number of voids to film thickness of a sample.

Example 1

(1) Insulation Layer 1
(a) Preparation of Raw Materials for Film
(Void Generating Agent "a")

Pellets of a polymethylpentene (PMP) resin (60% by mass, melt viscosity ($\eta 0$): 1,300 poise), a polypropylene (PP) resin (20% by mass, melt viscosity: 2,000 poise), and a polystyrene (PS) resin (20% by mass, melt viscosity ($\eta s$): 3,900 poise) were mixed, and supplied to a vent type twin screw extruder controlled to be 285° C. so as to knead them, whereby the void generating agent (raw material "a") was obtained.

(Polyester "b")

Silica particle containing polyethylene terephthalate (PET) resin was obtained by the following approach: When a temperature of an esterification reaction vessel reached 200° C., a slurry composed of terephthalic acid (86.4 parts by mass) and ethylene glycol (64.4 parts by mass) was supplied to the vessel, and antimony trioxide (0.03 parts by mass), magnesium acetate tetrahydrate (0.088 parts by mass) and triethylamine (0.16 parts by mass) were added as catalysts to the slurry while stirring.

Subsequently, following the pressurization and temperature elevation, an pressurized esterification reaction was performed under a gage pressure 0.343 MPa at a temperature of 240° C. Then, the pressure of the esterification reaction vessel was to the normal pressure, and trimethyl phosphate (0.040 parts by mass) was added. Furthermore, the vessel was heated to 260° C., and an ethylene glycol slurry (slurry concentration: 140 g/L) which contains agglomerate silica particles (manufacture by Shimadzu, SA-CP3, mean particle diameter: 1.0 μm) was added fifteen minutes after the addition of the trimethyl phosphate such that 500 ppm of the particles were added with respect to the formed polyester. Fifteen minutes later, the esterification reaction product thus obtained was transferred to a polycondensation reaction vessel, and polycondensation reaction was carried out under a reduced pressure at a temperature of 280° C. After terminating the polycondensation reaction, a filtration treatment was performed with a NASLON filter of which 95% cut diameter is 28 μm so as to provide a polyethylene terephthalate of which intrinsic viscosity is 0.62 dl/g (raw material "b").

(Titanium Oxide Particle Containing Master Batch "c")

The above mentioned polyethylene terephthalate (raw material "b") and anatase type titanium dioxide particles (mean diameter: 0.2 μm) which had been subjected to a surface treatment with a siloxane (manufactured by Sakai Chemical Industry Co., Ltd.) were mixed at a mass ratio 50/50, and kneaded with a vent type kneader so that the titanium oxide particle containing master batch "c" was prepared.

(b) Production for Film 1

The above mentioned raw materials dried under vacuum while being heated were continuously metered and continuously stirred while a mass ratio of a/b/c is 15/85/0 so that a raw material for "A" layer was obtained. Next, this raw material was supplied to a barrier type single screw extruder having a Dulmadge zone at its end so as to melt and knead the material, and then immediately supplied to a feed block (co-extrusion junction) via a gear pump, a filter, and a static mixer comprising twelve elements which were installed in a short pipe having a diameter of 50 mm.

On the other hand, the above mentioned raw materials were continuously metered such that a mass ratio of b/c is 60/40, so that a raw material for "B" layer was obtained, and then the raw material was supplied to a vent type twin screw extruder so as to melt and knead the material, which was then supplied to the above mentioned feed block via a gear pump, and a filter.

In the feed block, the layers were connected such that said B layers on both sides of said A layer have the same thicknesses. At this stage, rotation numbers of the extruders and the gear pumps of the A layer side and the B layer side were controlled such that a thickness ratio of B/A/B is 10/80/10 before stretching.

Subsequently, the molten polymers joined in the feed block were supplied to a coat hanger die located just below and directly connected to the feed block, and cast onto a cooling drum of which surface temperature was 0.30° C., so that an unstretched film with a thickness of 1.9 mm was produced. At this stage, air was sprayed at 10° C. on the opposite side of the molten polymers extruded onto the cooling drum lifting, so that the molten polymers were cooled and solidified from both sides thereof.

Next, after heating the unstretched film obtained as the above mentioned to 65° C. using a heating roll, it was stretched to 3.1 times between the rolls of which peripheral speeds are different. At this stage, in order to provide, from the both sides of the film, sufficient heat required for uniform stretching of the film, concentrating IR heaters were located on the both sides of the film between the lower speed roll and the higher speed roll so that they are opposed through the film.

Next, thus obtained monoaxially stretched film was transferred to a tenter, transverse stretching to 3.9 times was performed while heating from 120° C. to 150° C. Furthermore, the film was heat treated by spraying hot air at 220° C. for 30 seconds within the tenter. Then, cooling the film gradually to a room temperature over 40 seconds while carrying out a relaxing treatment of 2% in the transverse direction, so that a void containing laminated biaxially orientated polyester film of which apparent density is 0.87 g/cm$^3$ and thickness is 250 μm (film 1) was produced. Characteristics of the obtained film 1 are shown in Table 1.

(b) Production for Film 2

The above mentioned raw materials dried under vacuum while being heated were continuously metered and continuously stirred while a mass ratio of a/b/c is 8/87/5 so that a raw material for "A" layer was obtained. Next, this raw material was supplied to a barrier type single screw extruder having a Dulmadge zone at its end so as to melt and knead the material, and then immediately supplied to a feed block (co-extrusion junction) via a gear pump, a filter, and a static mixer comprising twelve elements which were installed in a short pipe having a diameter of 50 mm.

On the other hand, the above mentioned raw materials were continuously metered such that a mass ratio of b/c is 70/30, so that a raw material for "B" layer was obtained, and then the raw material was supplied to a vent type twin screw extruder so as to melt and knead the material, which was then supplied to the above mentioned feed block via a gear pump, and a filter.

In the feed block, the layers were connected such that said B layers on both sides of said A layer have the same thicknesses. At this stage, rotation numbers of the extruders and the gear pumps of the A layer side and the B layer side were controlled such that a thickness ratio of B/A/B is 10/80/10 before stretching.

Subsequently, the molten polymers joined in the feed block were supplied to a coat hanger die located just below and directly connected to the feed block, and cast onto a cooling drum of which surface temperature was 30° C. such that the B layer is located on the drum surface, so that an unstretched film with a thickness of 0.5 mm was produced.

Next, after heating the unstretched film obtained as the above mentioned to 65° C. using a heating roll, it was stretched to 3.2 times between the rolls of which peripheral speeds are different. At this stage, in order to provide, from the both sides of the film, sufficient heat required for uniform stretching of the film, concentrating IR heaters were located on the both sides of the film between the lower speed roll and the higher speed roll so that they are opposed through the film.

Next, thus obtained monoaxially stretched film was transferred to a tenter, transverse stretching to 4.0 times was performed while heating from 120° C. to 150° C. Furthermore, the film was heat treated by spraying hot air at 220° C. for 7 seconds within the tenter. Then, cooling the film gradually to a room temperature over 9 seconds while carrying out a relaxing treatment of 2% in the transverse direction, so that a void containing laminated biaxially orientated polyester film of which apparent density is 1.10 g/cm$^3$ and thickness is 50 μm (film 2) was produced. Characteristics of the obtained film 2 are shown in Table 1.

(2) High Frequency Electronic Part (Non-Contact Type RF Tag)

The non-contact type RF tag which is one of the embodiments of the high frequency electronic parts was produced using the above mentioned void containing biaxially oriented polyester laminate film as an insulation layer.

Figure 3:
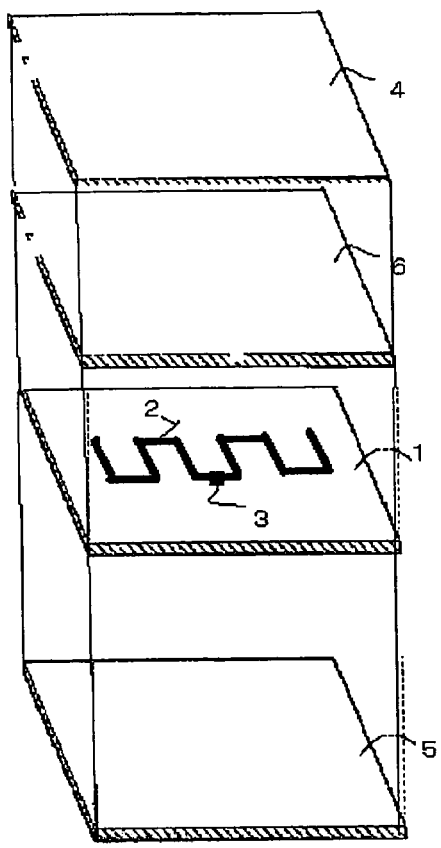
FIG. 3 is a drawing which shows a manufacture process of a non-contact type RF tag which is one of the embodiments of the high frequency electronic parts according to the present invention.

The production process of the non-contact type RF tag will be explained while using FIG. 3.

(a) An aluminum (Al) foil is first bonded onto one side (onto a surface on the B layer side) of the above mentioned void containing biaxially orientated polyester laminate film 1 (film 2). The foil on the surface foil is etched into a conductor pattern, so that a dipole antenna is formed. It is noted that instead of bonding and etching the foil, an electrically conductive paste may be directly printed as the conductor pattern 2.

(b) Next, an IC chip 3 is connected to a terminal of the conductor pattern 2.

First, the terminal of the conductor pattern 2 and its vicinity are bonded using an electrically anisotropic conductive film as a connection material. The IC chip 3 is bonded onto the electrically anisotropic conductive film such that the a connection of the IC chip 3 is located just above the terminal of the conductor pattern 2.

(c) Finally, the void containing biaxially orientated polyester laminate film 4 (film 1) is laminated on one side of the void containing biaxially orientated polyester laminate film 1 (film 2), and the void containing biaxially orientated polyester laminate film 5 (film 1) is laminated on the other side of the void containing biaxially orientated polyester laminate film 1 (film 2). Upon such lamination, an adhesive for such lamination is used, or a thermally adhesive film 6 (heat sealer) is used followed by shaping with a laminator, and then thus obtained laminate is stamped out into a predetermined shape so as to obtain the non-contact type RF tag.

Comparative Example 1

Example 1 was repeated so as to obtain the non-contact type RF tag except that a biaxially stretched polyethylene terephthalate film (manufactured by Toyobo, E5001) having a thickness of 50 μm which contained substantially no void <film 4> was used in place of film 2, and also except that a biaxially stretched polyethylene terephthalate film (manufactured by Toyobo, E5001) having a thickness of 250 μm which contained substantially no void <film 3> was used in place of film 1.

Characteristics of films 3 and 4 are shown in Table 1.

Figure 4:
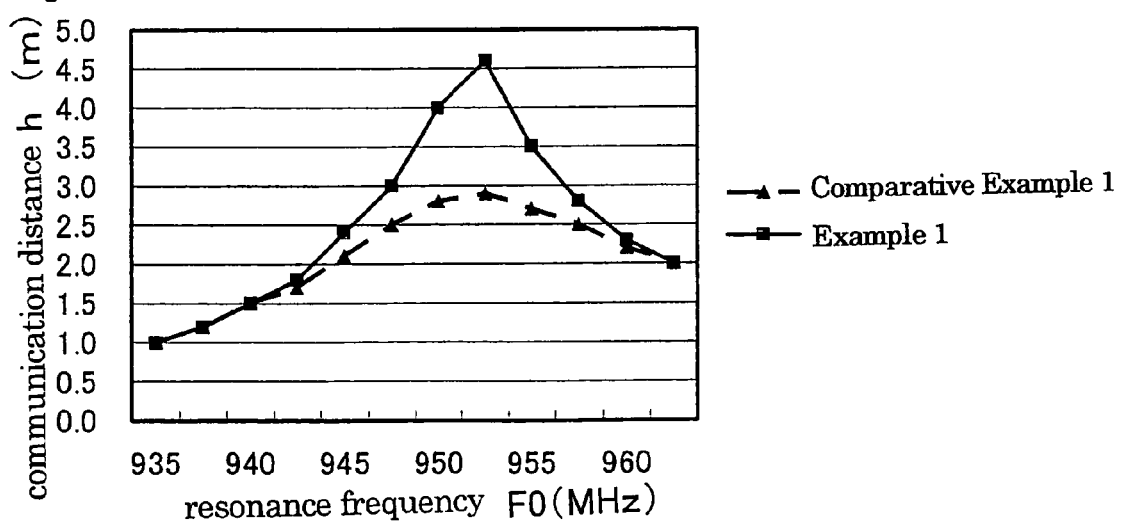
FIG. 4 is a drawing which shows a resonance frequency dependency of communication distance of non-contact type RF tags obtained in Example 1 and Comparative Example 1.

Resonance frequency dependency of communication range of the non-contact type RF tags obtained in Example 1 and Comparative Example 1 is shown in FIG. 4. It is clearly seen from FIG. 4 that the communication range increases when using the void containing biaxially stretched polyester laminate film (film 1), and the electrical properties of the insulation layer (film 1) in the high frequency electronic parts according to the present invention functions effectively.

Example 2

A flat cable which is one of the embodiments of the high frequency electronic parts was produced using the above mentioned void containing biaxially orientate polyester laminate film was used insulation layer.

Figure 5:
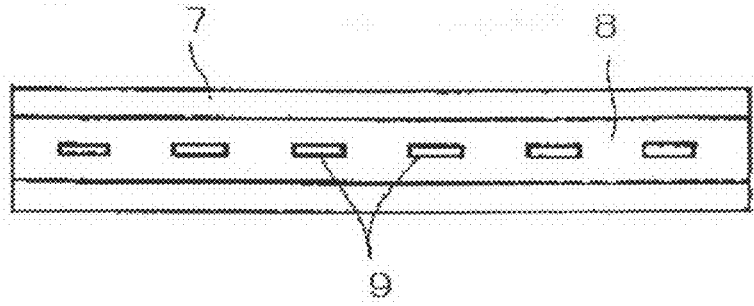
FIG. 5 is a drawing which shows a cross sectional view of a flat cable which is one of the embodiments of the high frequency electronic parts according to the present invention.

In order to estimate characteristics of the flat cable, a sample was produced according to the following procedures:

An adhesive coating having a predetermined thickness was formed on one side of the void containing biaxially orientate polyester laminate film having a thickness of 50 μm (film 2) using a T-die extruder whereby an insulation substrate was obtained. Then, parallel located ten tinned annealed copper flat conductors each having a thickness of 35 μm and a width of 0.3 mm are spaced with pitch of 0.5 mm were sandwiched by the above mentioned insulation substrate and another insulation substrate which was produced similarly, followed by passing them between heat rolls so as to laminate the substrates and the conductors together, whereby the sample was obtained. A cross sectional view of the sample is shown in FIG. 5 wherein numeral 7 indicates the insulation film, numeral 8 does the adhesive and numeral 9 does the conductor.

Comparative Example 2

Example 2 was repeated so as to produce a flat cable except that a biaxially orientated polyethylene terephthalate film (manufactured by Toyobo, E5001) having a thickness of 50 μm which contained substantially no void was used in place of the insulation film 7.

Image tests using a SMPTE color bar were carried out while using the flat cables of Example 2 and Comparative Example 2 as image signal cables of a liquid crystal display. After warming up of a monitor, the set up (brightness) was adjusted that the black+4IRE bar of the PLUGE signal was seen and the black-4IRE bar of the PLUGE signal was not seen. Then, the gain (video) was adjusted such that whiteness of the 100% white bar was not broken. The color adjustment was carried out by setting to only blue mode (green and red were off) and adjusting the HUE knob and the SAT knob such that no brightness difference is present between the color bar and the inversed color bar.

Figure 6:
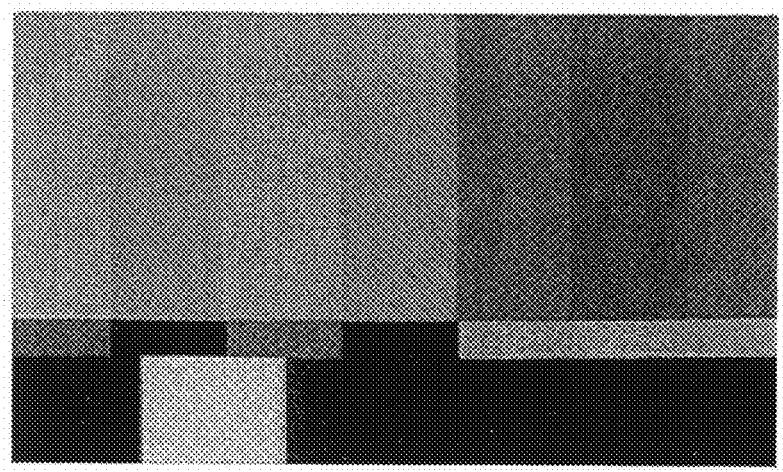
FIG. 6 is an image test result when a flat cable of Example 2 was used as an image signal cable for a liquid crystal display.
Figure 7:
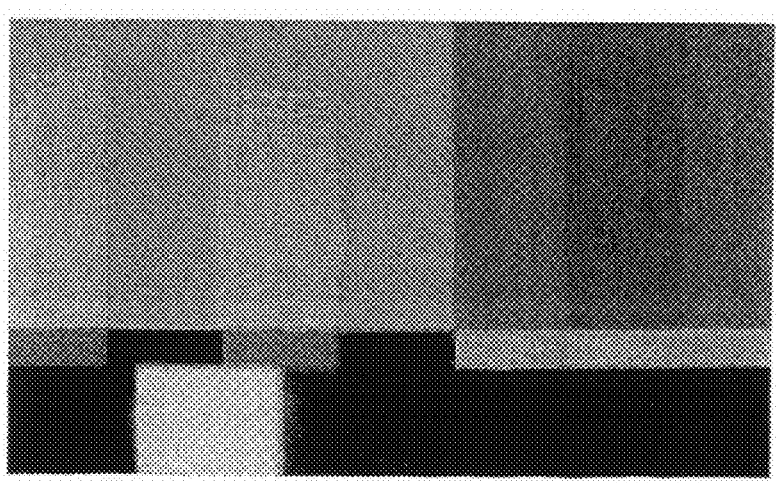
FIG. 7 is an image test result when a flat cable of Comparative Example 2 was used as an image signal cable for a liquid crystal display.

FIG. 6 and FIG. 7 show the results of the image tests when the flat cables of Examples 2 were used as the image signal cable of the liquid crystal display.

As shown in FIGS. 6 and 7, distortion was seen in the image with Comparative Example 2, while SMPTE color bar was transferred successfully with Example 2.

TABLE 1

|  |  | film 1 (with voids) | film 3 (without void) | film 2 (with voids) | film 4 (without void) |
|---|---|---|---|---|---|
| thickness | μm | 250 | 250 | 50 | 50 |
| apparent density | g/cm³ | 0.85 | 1.4 | 1.1 | 1.4 |
| void content | % | 35 | 0 | 20 | 0 |
| specific inductive capacity | — | 1.9 | 2.9 | 2.1 | 3.0 |
| dielectric dissipation factor (tan δ o) | — | 0.002 | 0.016 | 0.004 | 0.016 |
| dielectric breakdown voltage at thickness of 250 μm | kV | 23 (V1) | 11 (V0) | 24 (V1) | 14 (V0) |
| dielectric breakdown voltage ratio (V1/V0) | — | 2.1 | — | 1.7 | — |
| number of voids in thickness direction | voids | 95.0 | 0.0 | 16.5 | 0.0 |
| ratio of the number of voids to film thickness | voids/μm | 0.38 | 0.00 | 0.33 | 0.00 |

INDUSTRIAL APPLICABILITY

Since the stretched thermoplastic resin film which is excellent in the high frequency transmission characteristics due to its remarkably small dielectric loss, and also excellent in the electrical insulation characteristics, and further excellent in the less thinness, the mechanical strength, and the flexibility is used as the insulation layer in the high frequency electronic parts according to the present invention, those parts are acceptable in the application wherein miniaturization and/or inflection are aimed. Therefore, when high frequency electronic part is used for the RF-ID antenna circuit in the microwave manner or for the flexible flat cable, its effect appears most remarkably.

The invention claimed is:

1. A high frequency electronic part comprising:
    a conductor wiring for transmitting an electric signal of 100 MHz to 100 GHz, and
    an insulation layer composed of a void-containing thermoplastic resin film orientated in at least one direction by stretching,
    wherein said void-containing thermoplastic resin film includes voids in the range between 3 % and 45 % by volume, a number of voids present in a thickness direction of the film is five or more, and a ratio of the number of voids to the film thickness is in the range between 0.1 and 10 voids/μm.

2. The high frequency electronic part according to claim 1 wherein the void-containing thermoplastic resin film has a dielectric dissipation factor in the range between 0.0005 and 0.010 at 1 GHz.

3. The high frequency electronic part according to claim 1 wherein a dielectric breakdown voltage ratio (V1/V0) is larger than 1.2 wherein
    V1 is a dielectric breakdown voltage of the void-containing thermoplastic resin film having a thickness of 250 μm, and
    V0 is a dielectric breakdown voltage of a thermoplastic resin film having a thickness of 250 μm and substantially no voids.

4. The high frequency electronic part according to claim 1 wherein the void-containing thermoplastic resin film is in a layer structure comprising at least a surface layer and a void-containing layer, the surface layer comprising a resin composition which includes ceramic particles or metal particles subjected to an insulating treatment in the range between 0.01 % by mass and 60 % by mass.

5. The high frequency electronic part according to claim 1 wherein the void-containing thermoplastic resin film comprises a void-containing polyester film which is prepared by stretching to orientate, in at least one direction, a composition which comprises a polyester resin as a sea element and a thermoplastic resin as an island element which is incompatible with the polyester resin.

6. The high frequency electronic part according to claim 1, wherein the electronic part is an electronic device or element configured to deliver and receive a signal.

7. The high frequency electronic part according to claim 1, wherein the electronic part is a parallel arranged multi core electric wire in the form of a thin tape wherein both surfaces of parallel arranged conductors are sandwiched by plastic films.

* * * * *